United States Patent [19]

Nyul et al.

[11] Patent Number: 4,642,513
[45] Date of Patent: Feb. 10, 1987

[54] ELECTROOPTIC ASSEMBLY HAVING AN ADJUSTABLE WINDOW

[75] Inventors: Paul Nyul, New Holland, Pa.; Rudolph H. Hedel, West Windsor, N.J.

[73] Assignee: RCA Corporation, Princeton, N.J.

[21] Appl. No.: 699,557

[22] Filed: Feb. 8, 1985

[51] Int. Cl.$^4$ .................... H01J 5/02; H05B 33/02
[52] U.S. Cl. .................... 313/110; 313/498; 313/512; 357/72
[58] Field of Search ........... 313/110, 512, 498, 499; 357/72, 81, 17

[56] References Cited

U.S. PATENT DOCUMENTS

| | | | |
|---|---|---|---|
| 3,252,035 | 5/1966 | Buck, Jr. | 313/498 |
| 3,805,347 | 4/1974 | Collins et al. | 313/499 X |
| 3,821,590 | 6/1974 | Kosman et al. | 313/499 |
| 4,195,330 | 3/1980 | Savage, Jr. | 362/226 |
| 4,394,679 | 7/1983 | Hawrylo | 357/81 |
| 4,447,136 | 5/1984 | Kitamura | 350/432 |

Primary Examiner—Palmer C. DeMeo
Assistant Examiner—K. Wieder
Attorney, Agent, or Firm—B. E. Morris; W. J. Burke; H. R. Ball

[57] ABSTRACT

The invention is an improved electrooptic assembly which comprises an electrooptic device mounted on a header and enclosed by a cover with a light-transmissive window mounted therein. The header includes a base plate with two major surfaces and a minor surface connecting the major surfaces with a segment of the cover attached to the minor surface. The minor surface is non-perpendicular to the major surfaces, thus allowing adjustment of the position of the window to achieve optimum emission or detection.

6 Claims, 4 Drawing Figures

ELECTROOPTIC ASSEMBLY HAVING AN ADJUSTABLE WINDOW

The U.S. Government has rights to this invention pursuant to a government contract.

The invention relates to an electrooptic assembly including a cover with a light-transmissive window mounted therein whose position is adjustable relative to a header prior to the fastening of the cover to the header.

BACKGROUND OF THE INVENTION

An electrooptic assembly, such as that disclosed by Hawrylo et al. in U.S. Pat. No. 4,394,379, comprises an electrooptic device, such as a semiconductor light emitting or detecting element, mounted on a header and enclosed by a cover with a light-transmissive window mounted therein. The header generally includes a base plate having two parallel major surfaces and at least one minor surface connecting the major surfaces. The cover is typically attached to the minor surface by conventional methods such as welding or soldering. The header also includes a stud which is mounted on the first major surface of the base plate and is typically used for both heat dissipation and mounting of the electrooptic device. The electrooptic device is mounted either directly on the second major surface or on a mounting block which in turn is mounted on the second major surface.

The electrooptic device emits or detects light in a spatial distribution pattern which typically has an optical axis of symmetry representing a maximum in the intensity of the emission or the sensitivity of detection. The intensity of emission or sensitivity of detection is dependent on the angle of emergence or incidence of light on the window and thus it is desirable to have the optical axis normal to a major surface plane of the window. This is often not achieved due to variations in emission or detection characteristics of the device or mounting variations which can occur when the device is mounted on the header.

SUMMARY OF THE INVENTION

The invention is an electrooptic assembly including a header having two major surfaces and a minor surface connecting the major surfaces and non-perpendicular thereto. An electrooptic device, having an optical axis of symmetry, is mounted on the header and is enclosed by a cover with a light-transmissive window mounted therein. The cover is attached to the minor surface of the header. The non-perpendicular minor surface allows adjustments to be made to the position of the window relative to the optical axis of symmetry of the device prior to fastening the cover to the header.

DETAILED DESCRIPTION OF PREFERRED EMBODIMENTS

Figure 1:
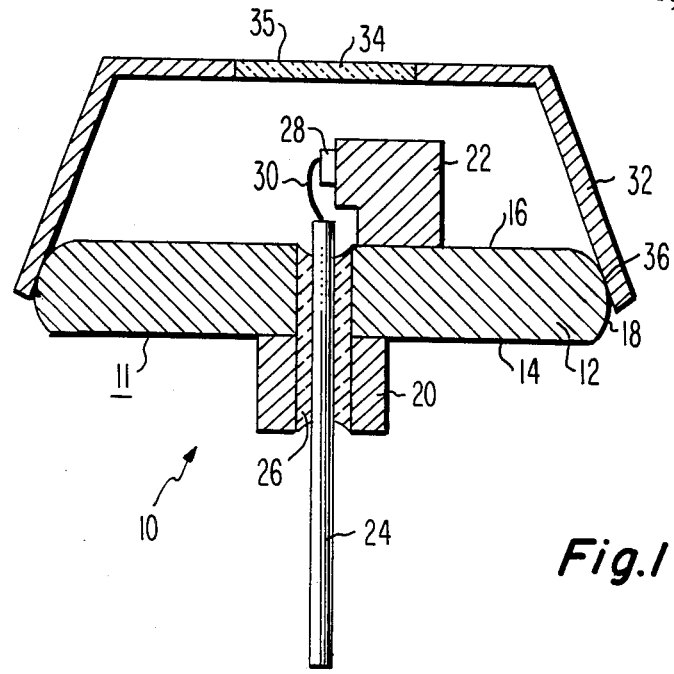
FIGS. 1-4 are cross-sectional views of four different embodiments of an electrooptic device of the invention.

In FIG. 1 an electrooptic assembly 10 includes a header 11, which comprises a base plate 12 with first and second major surfaces 14 and 16, respectively, and a minor surface 18 connecting but not perpendicular to one or both of the major surfaces 14 and 16. A stud 20 is attached to the first major surface 14, and a mounting block 22 is attached to the second major surface 16. A lead 24 extends through, and is electrically isolated from, the base plate 12 and the stud 20 by an insulating material 26, such as a glass or plastic encapsulant. An electrooptic device 28 is mounted on and electrically connected to the mounting block 22. One electrical connection is made from the device 28 through a bond wire 30 to the lead 24. A second electrical connection is made from the mounting block 22 through the base plate 12, to the stud 20. A cover 32, with a light-transmissive window 34 having a major surface plane 35 mounted therein, is attached to the base plate 12 where a segment 36 of the cover 32 is in contact with the minor surface 18. The electrooptic assembly 10 has a hemispherically curved minor surface 18 which is in contact with a planar segment 36 of the cover 32.

Figure 2:
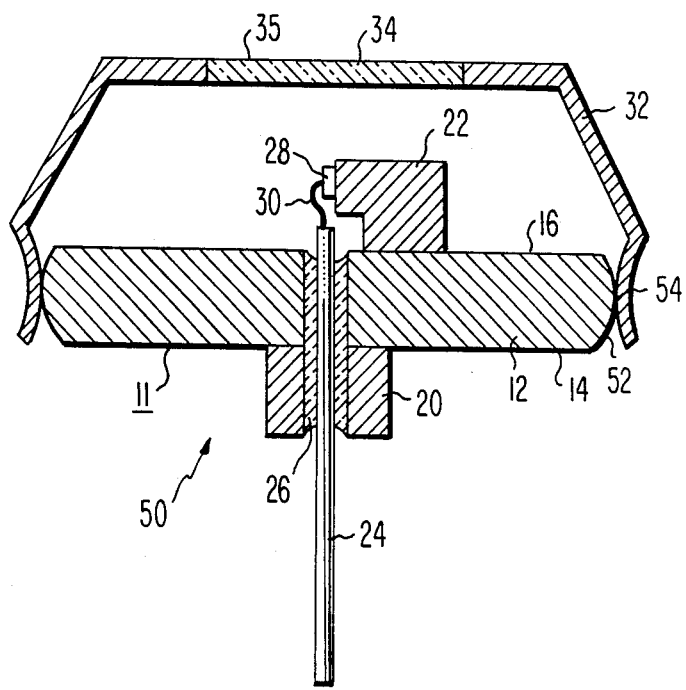
Figure 3:
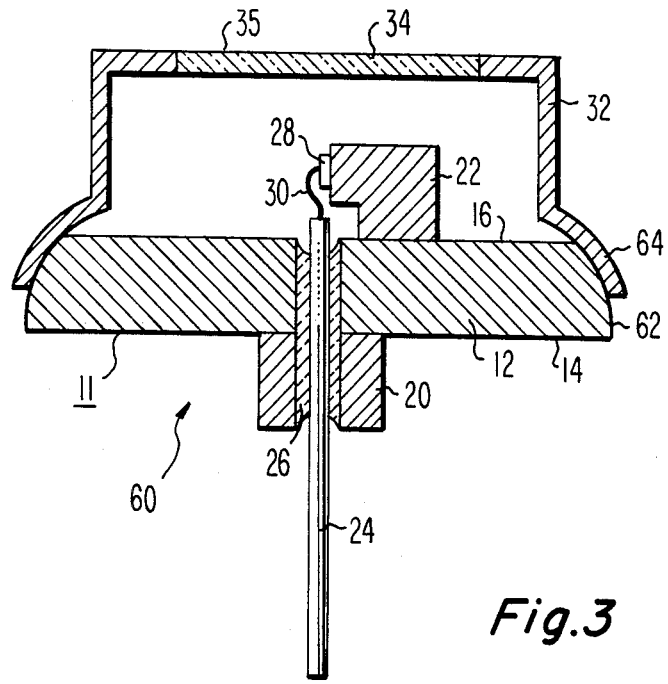
Figure 4:
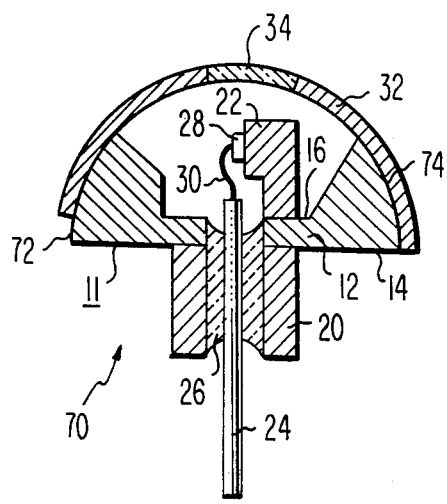

FIGS. 2-4 illustrate electrooptic assemblies 50, 60, and 70 wherein the identification of the common elements of the assemblies 50, 60, and 70 correspond to those of the assembly 10 of FIG. 1. In FIG. 2, the electrooptic assembly 50 has a hemispherically curved minor surface 52 in contact with a convex segment 54. In FIG. 3 the electrooptic assembly 60 has a concave minor surface 62 which is in contact with a concave segment 64. The segment 64 has a radius of curvature which is greater than the radius of the minor surface 62. In FIG. 4 the electrooptic assembly 70 has a hemispherically curved minor surface 72 and a hemispherically curved segment 74 whose radii extend from the same center.

The electrooptic assemblies of the invention are fabricated by machining or coining the base plate 12, typically made of an iron-nickel-cobalt alloy, so that the minor surface 18 is not perpendicular to the major surfaces 14 and 16. The mounting block 22 and the stud 20, typically made of copper, are attached to the base plate 12 by brazing. The lead 24 is mounted through the base plate 12 and the stud 20. The insulating material 26, such as plastic encapsulant or glass, is inserted to support the lead 24 and provide electrical isolation from the base plate 12 and the stud 20. The device 28 is mounted to the mounting block 22 by soldering or thermocompression bonding and the bond wire 30 is bonded from the device 28 to the lead 24. The metallized rim of the window 34 is brazed to the cover 32. The cover 32 is preferably formed of a material such as an iron-nickel-cobalt alloy whose expansion coefficient is approximately equivalent to the expansion coefficient of the window 34. The cover 32, with the window 34 mounted therein, is then mounted on the header 11.

Methods for adjusting the position of the surface of the window 34 relative to the optical axis of symmetry of the electrooptic device 28 depend upon whether the device is a light-emitter or a light-detector. A preferred method for adjusting the position of the major surface plane 35 relative to a light emitter, as disclosed by Hedel et al. in U.S. patent application Ser. No. 699,546, (RCA 81,681) entitled "APPARATUS AND METHOD FOR FABRICATING A LIGHT-EMITTING ASSEMBLY", filed concurrently herewith and incorporated by reference, comprises forming a reference beam to provide an alignment axis and positioning the window 34 at a predetermined angle relative to the alignment axis. The optical axis of symmetry of the output beam of the light emitter is then adjusted to be coincident with the alignment axis by positioning the emitting portion thereof coincident with the alignment axis and then angularly adjusting the header 11 to bring the optical axis into coincidence with the alignment axis.

A light-detecting assembly may be adjusted by positioning the major surface plane 35 of the window at a predetermined angle relative to the alignment axis and positioning the header 11, with the detector thereon, such that there is a maximum detection of the reference beam source. After proper adjustment is obtained, the segment 36 of the cover 32 in contact with the minor surface 18 is preferably spot welded and then beam welded to the minor surface 18 to form a hermetic seal.

We claim:

1. In an electrooptic assembly having an optical axis of symmetry comprising an electrooptic device mounted on a header and enclosed by a cover with a light transmissive window mounted therein, said header including a base plate having two major surfaces and a minor surface connecting the major surfaces; the improvement wherein the minor surface is curved and a segment of the cover contacts the minor surface, so as to allow adjustments to be made to the window relative to the optical axis of symmetry.

2. The assembly of claim 1 wherein the minor surface is hemispherically curved.

3. The assembly of claim 2 wherein the segment which contacts the minor surface is concave.

4. The assembly of claim 3 wherein the radius of concave curvature of the concave segment is greater than the radius of curvature of the minor surface.

5. The assembly of claim 4 wherein the radii of curvature of both the minor surface and the concave segment extend from a common center.

6. The assembly of claim 2 wherein the segment which contacts the minor surface has a convex curvature.

* * * * *